(12) United States Patent
Liu et al.

(10) Patent No.: US 7,169,469 B2
(45) Date of Patent: Jan. 30, 2007

(54) PARTICLE-REMOVING WAFER

(75) Inventors: Guan Heng Liu, Hsin-Chu (TW); Tain Show Lin, Tao-Yung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 75 days.

(21) Appl. No.: 10/788,756

(22) Filed: Feb. 27, 2004

(65) Prior Publication Data
US 2005/0191499 A1    Sep. 1, 2005

(51) Int. Cl.
B32B 9/00 (2006.01)
B32B 27/00 (2006.01)
(52) U.S. Cl. .................. 428/343; 428/422; 428/704
(58) Field of Classification Search ........... 428/343, 428/345, 422, 704
See application file for complete search history.

(56) References Cited

U.S. PATENT DOCUMENTS 6,010,916 A * 1/2000 Horton et al. ............... 438/17
6,159,773 A * 12/2000 Lin ............................ 438/117

FOREIGN PATENT DOCUMENTS

JP       11329327 A  * 11/1999

* cited by examiner

Primary Examiner—Ramsey Zacharia
(74) Attorney, Agent, or Firm—Tung & Associates

(57) ABSTRACT

A particle-removing wafer is disclosed which is suitable for removing particles from a wafer support surface such as a wafer chuck used to support semiconductor wafers during the testing of IC devices on the wafers, for example. The particle-removing wafer includes a support body on which is provided a particle-adherent layer having a particle-adherent surface to which particles adhere when the particle-adherent surface is placed into contact with the particles. Consequently, upon subsequent placement of a production wafer on the wafer chuck, particles which may otherwise induce cracking of the wafer are no longer present on the chuck.

2 Claims, 2 Drawing Sheets

PARTICLE-REMOVING WAFER

FIELD OF THE INVENTION

The present invention relates to devices used to remove particles from a surface. More particularly, the present invention relates to a novel particle-removing wafer which is effective in removing particles from a surface, particularly from a wafer chuck on a die-testing apparatus used to test integrated circuits fabricated on a wafer in the semiconductor industry.

BACKGROUND OF THE INVENTION

A conventional method used by the semiconductor industry in the manufacturing of semiconductor integrated circuits includes the steps of fabrication, wafer sort, assembly and test, respectively. As shown in FIG. 1, in the fabrication step, as many as several thousand dies (integrated circuits) 5 are formed onto a semiconductor wafer 4. In the wafer sort step, each of the dies 5 on the wafer 4 is tested to determine its electrical characteristics and operability, and defective dies are distinguished from operable dies. The defective dies are often marked by an ink mark at the wafer sorting step. In the assembly step, the unmarked, operable dies are assembled into a package, and in the test step, the packaged integrated circuits are tested for operability and reliability.

At the wafer sort step, the dies are tested to establish which dies on the wafer function properly. Each die is tested to all functional product specifications for both DC and AC parameters. Four testing objectives are pursued: (1) chip functionality, in which all chip functions are tested to ensure that only fully-functional chips are assembled and packaged in subsequent steps; (2) chip sorting, in which chips are separated or sorted on the basis of their operating speed performance under various voltage and timing conditions; (3) fab yield response, which yields important information that may lead to improvements in the overall fabrication process; and (4) test coverage, in which high test coverage of the internal device nodes is achieved at the lowest possible cost. The wafer sort procedure is similar to the in-line parametric test except that every die on the wafer is tested, in many cases using the same automated test equipment (ATE). Furthermore, the wafer sort procedure is usually located in a separate facility under less stringent purity conditions than those in which the parametric test is carried out, since wafer fabrication is essentially complete.

In automated wafer handling during wafer sort, a correlation wafer is used to verify tester setup. The correlation wafer is a control wafer the functionality of which has been verified and ensures that the testing system is working properly. After indexing from the cassette to the prober, the wafers are mounted on a vacuum chuck with Z (vertical) positioning. Using software, mechanical probe needles are aligned and contacted with bond pads on the wafer to establish electrical communication between the testing equipment and the dies on the wafer. The probes are interfaced with the ATE to perform the range of AC functional tests based on test algorithms. The type, number and order of tests are defined by the test program.

After testing, die found to be defective are labeled in a computer database to exclude the die from subsequent packaging steps. The labeling method is typically performed by placing a drop of ink on each unacceptable die. Because the ink marking process can be messy and introduce possible contaminants onto the chip, electronic wafer maps are increasingly being used to create a computer image of chip location and test results to categorize good and bad die on the wafer. At the chip assembly stations, the electronic wafer maps are downloaded into an equipment database to ensure that defective chips will not be packaged.

As further shown in FIG. 1, in an integrated circuit pattern of each dice 5, the input, output, power supply and other terminals of the circuit are formed by multiple metalized contact pads 6, adjacent ones of which are usually deployed in lines along the periphery or margins of the pattern in what is commonly known in the art as a test key pattern. Metal lines or traces 7 electrically connect the contact pads 6 to the circuit elements of the dice 5. The outline of the testkey pattern is either square or rectangular, and the marginal locations of the contact pads thereon depend on the circuit configuration and the available marginal space. Thus, in a relatively simple circuit pattern, all of the marginal space may be available for contact pads, whereas in more complex circuits, portions of the circuit may invade the marginal areas so that contact pad placement is restricted to the free marginal areas. In some instances, therefore, the contact pads may lie in more or less uniform rows along the margins, and in other cases, the contact pads may be randomly spaced from each other.

Immediately following manufacture of the IC, the electrical characteristics of the device must be tested using a test probe assembly which includes a test probe card consisting of a printed circuit board having an opening therein to provide access to an IC pattern. The opening is surrounded by a ring of conductive probe needles connected by the printed circuit card to terminals for connection to test equipment appropriate for testing the circuit. The number of probe needles in the ring determines the maximum capacity of the probe card. The tips of the probe needles are ideally all disposed at the same height level and same angle, but these and other parameters of the needles fluctuate somewhat for a number of reasons.

The effectiveness, reliability and repeatability of IC testing using a probe card depends on a number of factors and characteristics of the probe card, and particularly the probe needles, including size, alignment, leakage, contact resistance and the force applied by the needles. For this reason, each probe card is usually designed for a particular testkey pattern on a wafer having a specific pitch and number of contact pads to be tested, and each probe card is typically incompatible with other testkey patterns. Consequently, fabrication of chips having various testkey patterns requires that a probe card that matches each testkey pattern be designed and manufactured to fit that pattern before those chips can tested.

Referring next to FIG. 2, a typical conventional wafer testing apparatus 10 includes a wafer chuck 12 on which a wafer 24 to be tested is placed. The wafer chuck 12 typically includes multiple vacuum openings 14 through which a vacuum pressure force 18 is applied to the backside 26 of the wafer 24 to secure the wafer 24 to the wafer support surface 16 of the wafer chuck 12. As the wafer 24 is held against the wafer support surface 16, a probe card (not shown), along with an electronic interface and testing instrumentation, is used to test IC devices (not shown) on the upward-facing patterned surface 28 of the wafer 24.

After testing of each wafer 24, and particularly during switching between lots of wafers to be tested or during periodic maintenance or repair of the testing equipment, particles 20 from the wafer 24 or from the environment frequently fall on the wafer support surface 16. Consequently, upon application of the vacuum pressure force 18 to the backside 26 of a subsequent wafer 24 tested on the wafer chuck 12, the particles 20 are sandwiched between the wafer 24 and the wafer chuck 12. Each particle 20 applies an upward point force 22 against the wafer 24, frequently inducing a cross-line crack 30 in the wafer 24, particularly in wafers 24 having a thickness of less than or equal to about 15 mils. Particles 20 having a size as small as 0.5 mm are capable of inducing a crack 30 in the wafer 24.

Conventional methods for removing particles from a wafer chuck in a testing apparatus include the use of an air gun or nozzle to blow particles from the chuck. However, this method is only partially effective in removing the particles from the chuck. Accordingly, a device is needed for the effective removal of particles from a wafer chuck prior to the placement of wafers on the chuck, particularly in the testing of IC devices fabricated on the wafer.

An object of the present invention is to provide a novel device which is capable of removing particles from a wafer support surface.

Another object of the present invention is to provide a novel device which is capable of preventing or reducing particle-induced cracking of a wafer as the wafer is adhered against a wafer chuck.

Still another object of the present invention is to provide a particle-removing wafer which may be used to remove particles from a variety of wafer-supporting surfaces.

Yet another object of the present invention is to provide a novel particle-removing wafer which has a particle-adherent surface for removing particles from a wafer support surface.

A still further object of the present invention is to provide a method of removing particles from a wafer support surface, including providing a particle-removing wafer having a particle-adherent surface, placing the particle-adherent surface into contact with particles on the wafer support surface, and removing the particle-removing wafer from the wafer support surface.

SUMMARY OF THE INVENTION

In accordance with these and other objects and advantages, the present invention is generally directed to a novel particle-removing wafer which is suitable for removing particles from a wafer support surface such as a wafer chuck used to support semiconductor wafers during the testing of IC devices on the wafers, for example. The particle-removing wafer includes a support body on which is provided a particle-adherent surface to which particles adhere when the particle-adherent surface is placed into contact with the particles. Consequently, upon subsequent placement of a production wafer on the wafer chuck, particles which may otherwise induce cracking of the wafer are no longer present on the chuck.

In a typical embodiment, the support body is a silicon wafer. The particle-adherent surface on the support body may be an adherent plastic film. The adherent plastic film may be polytetrafluoroethylene (TEFLON), for example. An elastic pad, such as rubber, may be provided on the support body. A two-sided adhesive layer may provide adhesion between the particle-adherent surface and the elastic pad.

The present invention further includes a method of removing particles from a wafer support surface. The method includes providing a particle-removing wafer having a particle-adherent surface, placing the particle-adherent surface into contact with particles on the wafer support surface, and removing the particle-removing wafer from the wafer support surface. A brush may be used to remove the adherent particles from the particle-adherent surface of the particle-removing wafer.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in the removal of particles from a wafer chuck for holding wafers during testing of integrated circuit devices fabricated on the wafer. However, the invention is not so limited in application and is more generally applicable to the removal of particles from wafer support surfaces in other semiconductor fabrication processes as well as in a variety of industrial applications.

Figure 1:
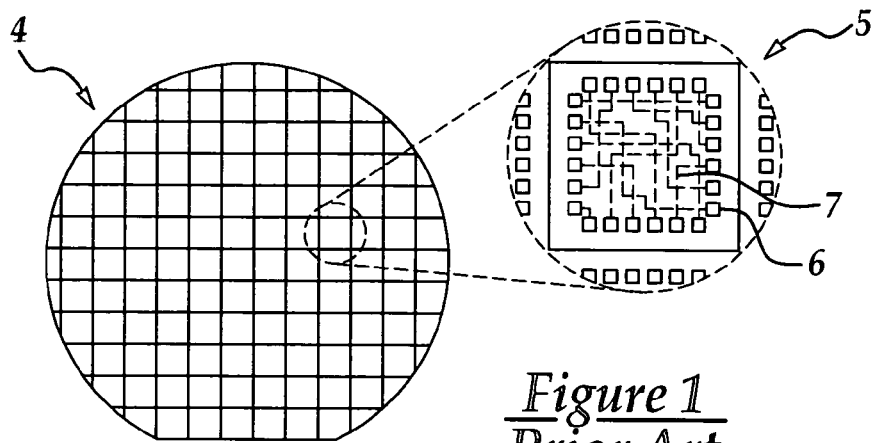
FIG. 1 is a schematic view illustrating a wafer with multiple integrated circuits, or die, fabricated thereon and one of the die on the wafer enlarged to show various components thereof.
Figure 2:
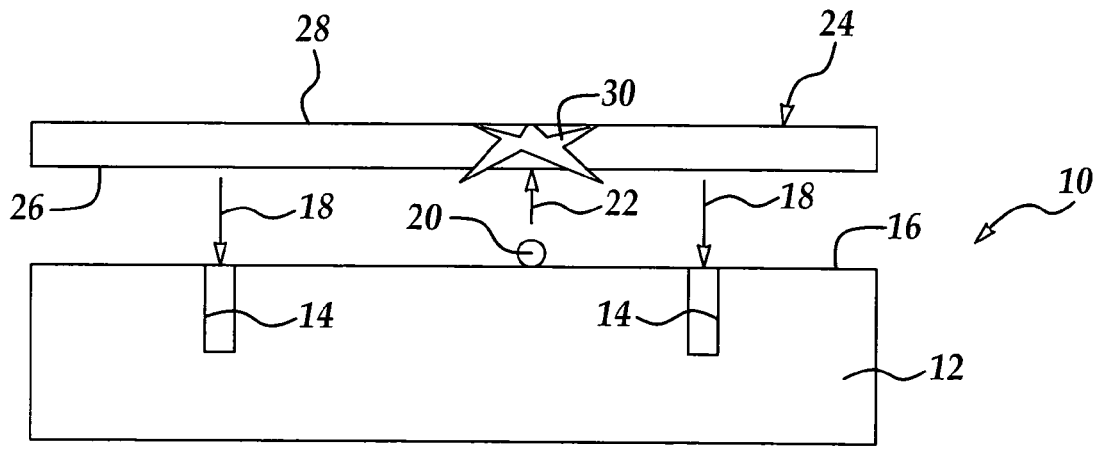
FIG. 2 is a side view, partially schematic, of a wafer chuck and more particularly illustrating placement of a wafer onto the wafer chuck with a particle on the chuck.
Figure 3:
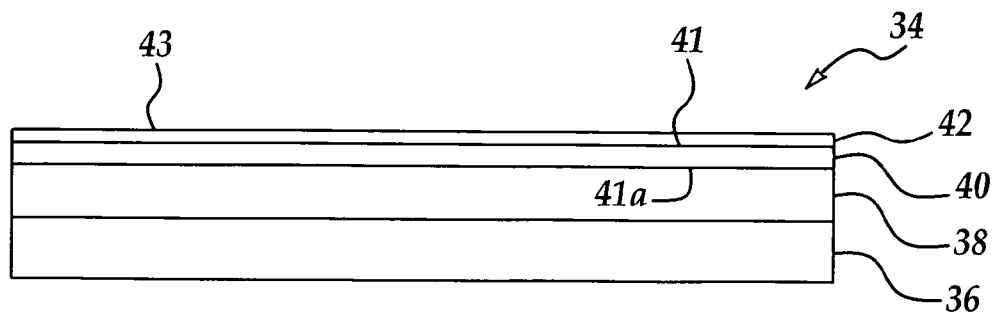
FIG. 3 is a cross-section of a particle-removing wafer of the present invention.

Referring initially to FIG. 3, an illustrative embodiment of the particle-removing wafer of the present invention is generally indicated by reference numeral 34. The particle-removing wafer 34 is typically multi-layered and may include a support body 36, a resilient layer 38 provided on the support body 36, an adhesive layer 40 provided on the resilient layer 38 and a particle-adherent layer 42 provided on the adhesive layer 40. Preferably, the particle-adherent layer 42 is capable of retaining particles while being non-adherent to the touch or with respect to contacting planar surfaces. The adhesive layer 40 and the resilient layer 38, which underlie the particle-adherent layer 42, render the particle-removing wafer 34 capable of retaining particles having a sharp or pointed configuration, as hereinafter further described.

The support body 36 of the particle-removing wafer 34 may be a silicon wafer, for example. The support body 36 may be a 6" or 8" diameter silicon wafer, in non-exclusive particular. However, it is understood that the support body 36 may be any suitable alternative material or size which is capable of supporting a layer or layers of material thereon. Preferably, the support body 36 has a thickness of typically about 20 mils, although this thickness may vary depending on the application.

The resilient layer 38, which is typically rubber, is provided on the support body 36. The resilient layer 38 may be attached to the support body 36 using glue, for example, or any other suitable adhesive. The resilient layer 38 has a thickness of typically about 20 mils, although this thickness may vary depending on the application.

The adhesive layer 40 is provided on the resilient layer 38. Preferably, the adhesive layer 40 includes both an upper adhesive surface 41 and a lower adhesive surface 41a to facilitate attachment of the adhesive layer 40 to the underlying resilient layer 38 and attachment of the overlying particle-adherent layer 42 to the adhesive layer 40. The thickness of the adhesive layer 40, which may vary depending on the application, is typically about 0.2 mm.

The particle-adherent layer 42, having an exposed particle-adherent surface 43, is attached to the underlying adhesive layer 40. Preferably, the particle-adherent layer 42 is a plastic polytetrafluoroethylene (TEFLON) film. The particle-adherent layer 42 has a thickness of typically about 0.1 mm, which may vary depending on the application.

Figure 4:
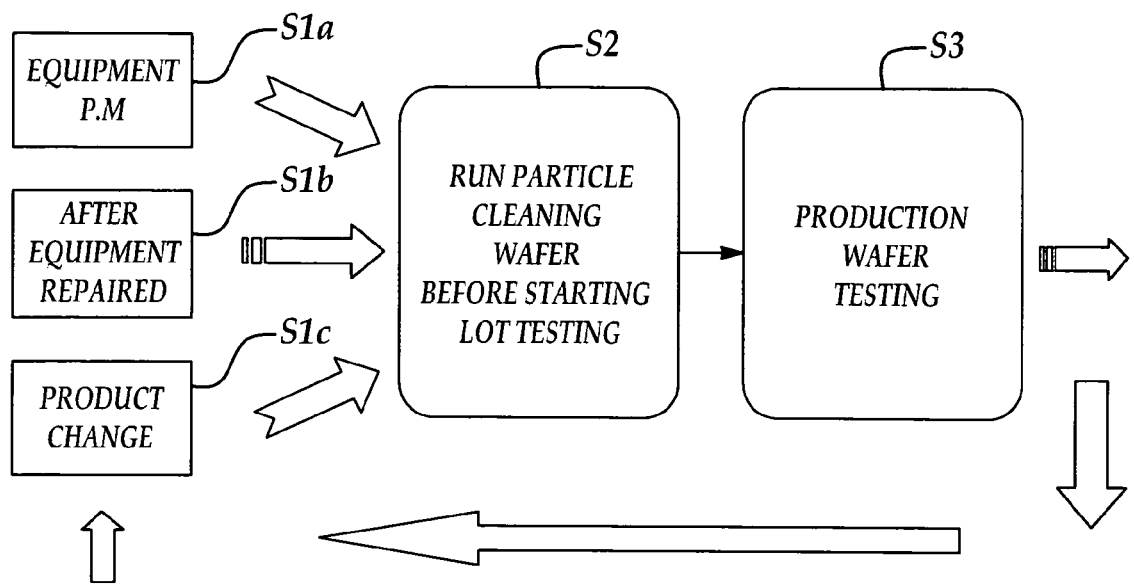
FIG. 4 is a flow diagram illustrating a typical sequence of process steps according to the present invention.
Figure 5:
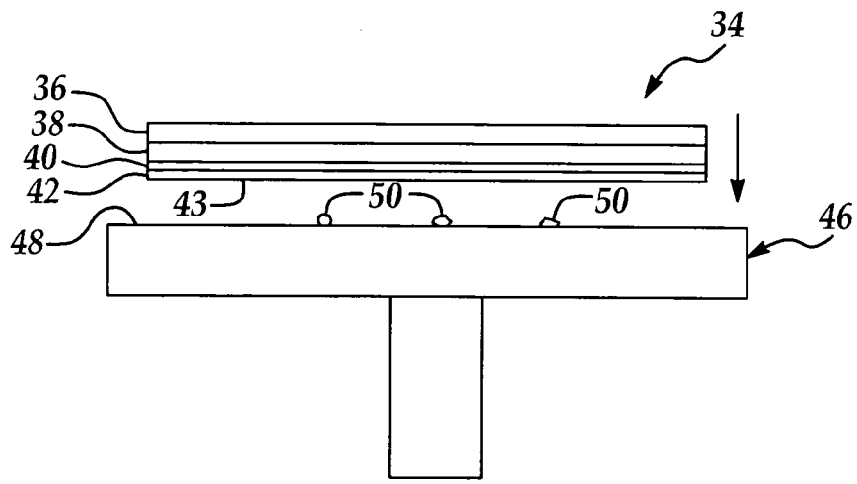
FIG. 5 is a cross-section of a wafer chuck, illustrating removal of particles from the wafer chuck using the particle-removing wafer of the present invention.
Figure 6:
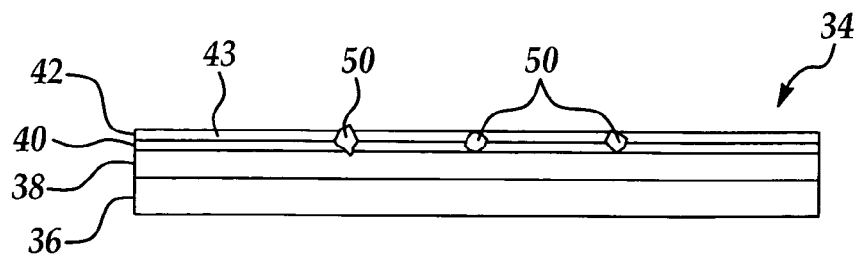
FIG. 6 is a cross-section of the particle-removing wafer, with multiple particles adhering to the particle-adherent surface of the wafer.

Referring next to FIGS. 4–6, the particle-removing wafer 34 is typically used to remove one or multiple particles 50 from a wafer-supporting surface 48 of a wafer chuck 46, as shown in FIG. 5. The wafer chuck 46 is typically used to support a production wafer (not shown) during the testing of IC devices on the wafer. However, it is understood that the wafer chuck 46 may be any type of wafer chuck or support from which particles are to be removed prior to support of a production wafer thereon.

As shown in FIG. 5, particles 50 tend to fall on the wafer chuck 46 during equipment PM (periodic maintenance), as indicated in S1a of FIG. 4; during or after equipment repair, as indicated in S2a; or during removal of a production wafer from the wafer chuck 46 preparatory to placement of a subsequent production wafer onto the wafer chuck 46. The particles 50 have a diameter or width of from typically about 0.5 mm to typically about 1 mm. As indicated in step S2 of FIG. 4, the particle or particles 50 must be removed from the wafer chuck 46 prior to placement of a subsequent production wafer on the wafer chuck 46. This prevents particle-induced cracking of or damage to the production wafer or wafers as each wafer is typically vacuum-pulled against the wafer-supporting surface 48.

As shown in FIG. 5, the particle or particles 50 are removed from the wafer-supporting surface 48 of the wafer chuck 46 by inverting and then placing the particle-removing wafer 34 on the surface 48. The vacuum-suction mechanism (not shown) of the wafer chuck 46 is then typically actuated to vacuum-pull the particle-removing wafer 34 against the surface 48. Accordingly, the particle-adherent surface 43 on the particle-adherent layer 42 of the particle-removing wafer 34 contacts both the wafer-supporting surface 48 on the wafer chuck 46 and the particles 50 thereon. The vacuum-suction mechanism of the wafer chuck 46 is then turned off to facilitate lifting of the particle-removing wafer 34 from the surface 48.

As the particle-removing wafer 34 is lifted from the wafer chuck 46, the particles 50, which remain attached to the particle-adherent surface 43, as shown in FIG. 6, are lifted from the wafer-supporting surface 48. The particle-removing operation using the particle-removing wafer 34 may be carried out at ambient temperature, or typically about 25.35 degrees C. The adhering particles 50 may be removed from the particle-adherent surface 43, for subsequent use of the particle-removing wafer 34, typically by sweeping a brush (not shown) across the particle-adherent surface 43, for example.

It will be appreciated by those skilled in the art that the resilient layer 38 and the adhesive layer 40, which underlie the particle-adherent layer 42, enhance the adherence of sharp-cornered or pointed particles 50 to the particle-removing wafer 34 to remove these as well as smooth particles 50 from the wafer chuck 46. Furthermore, the particle-adherent surface 43 does not have a tendency to adhere to the wafer-supporting surface 48 of the wafer chuck 46, thereby facilitating easy removal of the particle-removing wafer 34 from the wafer chuck 46.

As indicated in step S3 of FIG. 4, after use of the particle-removing wafer 34, the wafer-supporting surface 48 of the wafer chuck 46, substantially devoid of potential wafer-damaging particles 50, is in suitable condition to support actual production wafers (not shown) of a wafer lot, for example, during testing or processing of the wafers. The cleaned wafer-supporting surface 48 provides a flat, planar surface for the vacuum-adherence of each wafer to the wafer chuck 46 during testing or processing of the wafers. Consequently, particle-induced cracking of the wafers is eliminated or substantially reduced.

After the successive wafers in the wafer lot have been tested or processed and a subsequent lot of wafers is to be tested or processed on the wafer chuck 46, as indicated in step S1c of FIG. 4, the particle-removing wafer 34 is typically again used to remove a particle or particles 50 from the wafer-supporting surface 48 of the wafer chuck 46, typically in the manner heretofore described. The particle-removing wafer 34 is also typically used to remove particles from the wafer-supporting surface 48 after periodic maintenance of the testing or processing equipment (step S1a) or after repair of the testing or processing equipment (step S1b).

While the preferred embodiments of the invention have been described above, it will be recognized and understood that various modifications can be made in the invention and the appended claims are intended to cover all such modifications which may fall within the spirit and scope of the invention.

What is claimed is:

1. A particle-removing wafer, comprising:
   a support body; said support body comprises a silicon wafer;
   a resilient layer carried by said support body;
   an adhesive layer carried by said resilient layer; and
   a particle-adherent layer having a particle-adherent surface carried by said adhesive layer, said particle-adherent layer comprises a polytetrafluoroethylene film.

2. The particle-removing wafer of claim 1 wherein said adhesive layer comprises a pair of adhesive surfaces.

* * * * *